Jan. 13, 1970 J. B. GILLETT 3,489,963

INTEGRATED DIFFERENTIAL TRANSISTOR

Filed June 16, 1967 2 Sheets-Sheet 1

INVENTOR.
JOHN B. GILLETT

BY Harry M Weiss
ATTORNEY

United States Patent Office 3,489,963
Patented Jan. 13, 1970

3,489,963

INTEGRATED DIFFERENTIAL TRANSISTOR

John B. Gillett, Whitenap, Romsey, Hants, England, assignor to International Business Machines Corporation, Armonk, N.Y., a corporation of New York Filed June 16, 1967, Ser. No. 646,726
Int. Cl. H01l *11/00, 3/00;* H03f *3/14*
U.S. Cl. 317—235 6 Claims

ABSTRACT OF THE DISCLOSURE

This disclosure is directed to a monolithic integrated semiconductor device which produces a well-balanced differential amplifier in monolithic form. This device uses a flow of majority carriers to affect the bias on a junction in a bipolar transistor. Two bipolar transistor devices are essentially fabricated from a single transistor geometry.

BACKGROUND OF THE INVENTION

The present invention relates to a semiconductor device.

In a known form of differential amplifier, a pair of transistors have their emitters directly coupled together, the bases of the transistors forming the input terminals and the collectors of the transistors forming output terminals. With such an arrangement, it is impossible that the transistors be evenly matched so that a substantially zero difference exists between the signals appearing at the output terminals when the input signals applied to the input terminals are equal.

An object of the present invention is to provide an improved semiconductor device which may be used as a differential amplifier.

BRIEF DESCRIPTION OF THE FIGURES

In order that the invention may be readily carried into effect, a preferred embodiment thereof will now be described, by way of example, with reference to the accompanying diagrammatic drawings, in which.

DESCRIPTION OF THE PREFERRED EMBODIMENTS

According to the present invention, a semiconductor device comprises:

A first region of semiconductor material of a first conductivity type;

A second region of opposite conductivity type formed within said first region;

A third region of said first conductivity type formed within the second region;

A first base contact in the second region;

A second base contact in said second region and separated from said first base contact by said third region;

A first collector contact arranged within said first region;

A second collector contact arranged within said first region and spaced from said first collector contact by said second and third regions;

An emitter contact within said third region, and

Means for reducing the flow of electrons between said first and second collector contacts.

Figure 1:
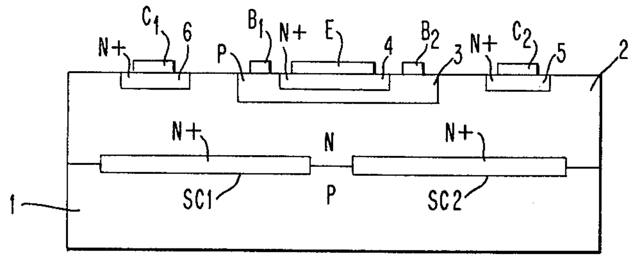
FIGURE 1 is a cross-sectional view of a semiconductor device.
Figure 2:
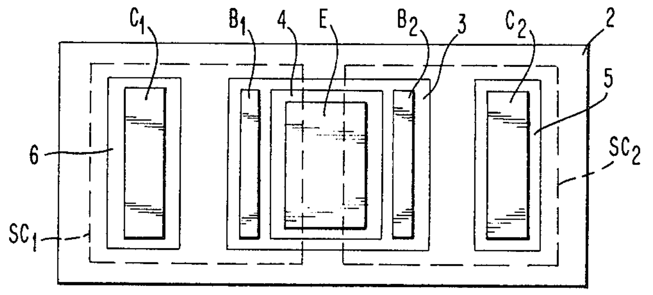
FIGURE 2 is a plan view of the semiconductor device shown in FIGURE 1.

Referring now to FIGURES 1 and 2, a slice 1 of P type conductivity semiconductor material, for example silicon, has formed thereon a layer 2 of N type conductivity semiconductor material, for example by epitaxial deposition. A base region 3 of P type conductivity is formed within the layer 2 and an emitter region 4 of N type conductivity is formed within the region 3. High conductivity regions 5 and 6 are provided within the layer 2 which regions may extend down to regions $SC_1$ and $SC_2$. Collector contacts $C_1$ and $C_2$ are provided to the regions 6 and 5 respectively, base contacts $B_1$ and $B_2$ are provided to the region 3, and a common emitter contact E is provided to the emitter region 4. Buried subcollector regions $SC_1$ and $SC_2$ of high conductivity N type material are formed within or adjacent the layer 2 respectively beneath the base $B_1$ and collector $C_1$ and beneath the base $B_2$ and collector $C_2$.

Figure 3:
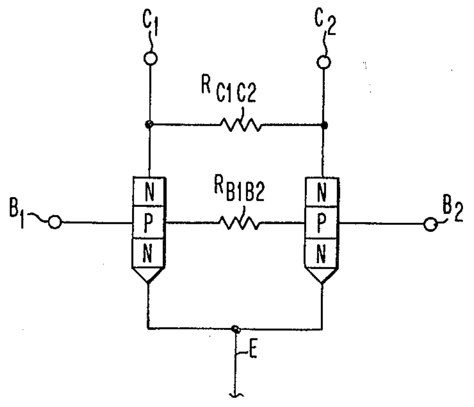
FIGURE 3 is an equivalent circuit of the device shown in FIGURES 1 and 2.

FIGURE 3 shows the equivalent circuit of the device shown in FIGURE 1 and although at first sight it appears to be similar to the above-mentioned known form of differential amplifier with a resistance $R_{B1B2}$ between the bases and a resistance $R_{C1C2}$ between the collectors, the action of the device is quite different. In operation the input signals are applied to the bases $B_1$ and $B_2$. Assume for the moment that the base $B_1$ is positive with respect to the base $B_2$, there will be a lateral flow of majority carriers within the P type channel defined by the emitter-base junction and the base-collector junction. Because of this lateral flow of majority carriers the bias across the emitter-base junction will vary from the base $B_1$ to the base $B_2$. Thus there will be a greater tendency for electrons to move from the emitter towards the base $B_1$ and consequently the collector $C_1$ than to the base $B_2$ and collector $C_2$. To increase this tendency, the subcollector regions $SC_1$ and $SC_2$ provide low resistance paths for electrons flowing between the associated bases and collectors and tend to reduce interaction between the two halves of the device. An amplified difference signal appears at the collector electrodes $C_1$ and $C_2$. If the base electrode $B_2$ becomes more positive than the base electrode $B_1$, then the flow of majority carriers will be reversed and consequently more electrons will tend to flow towards the collector electrode $C_2$. The differential input impedance of the device is approximately $R_{B1B2}$ controlled by the geometry and sheet resistance of the base region 3. The differential output impedance is approximately $R_{C1C2}$ defined by the collector geometry and high collector resistivity.

Figure 4:
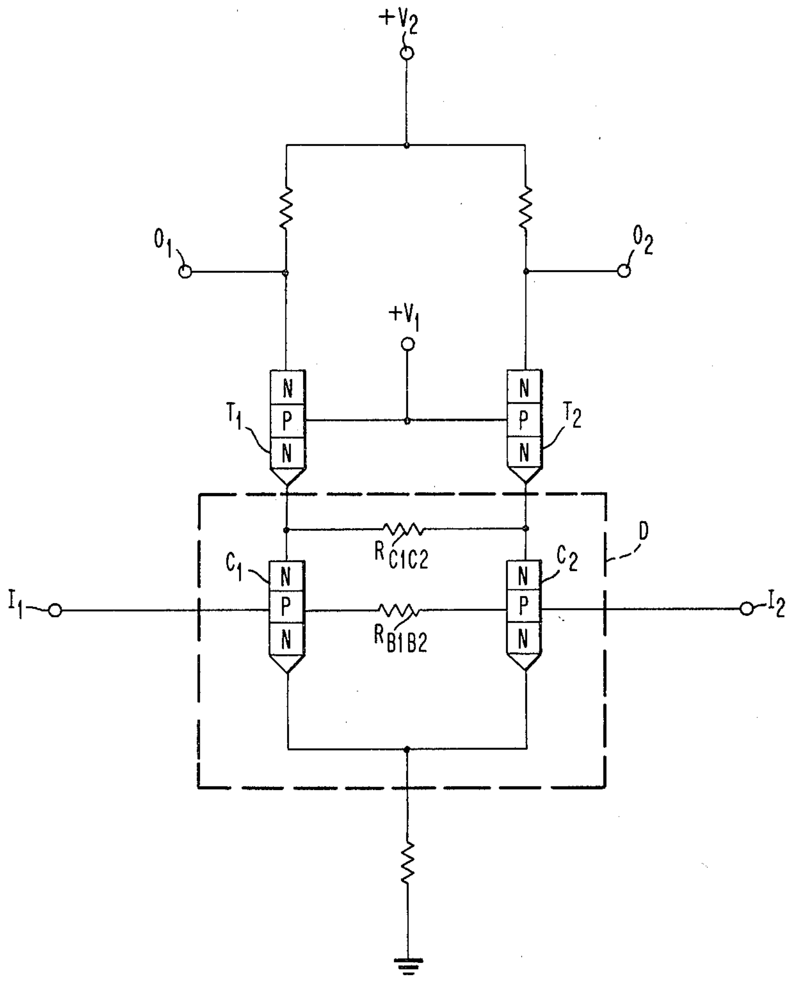
FIGURE 4 shows the device shown in FIGURES 1 and 2 used in a high frequency amplifier.

The effect of the output impedance may be reduced to negligible proportions by following the stage with a differential cascode circuit as shown in FIGURE 4.

Referring to FIGURE 4, the semiconductor device D shown in FIGURES 1 and 2 has its base electrodes connected as inputs $I_1$ and $I_2$. The collectors of the device D are connected to the emitters of transistors $T_1$ and $T_2$. The collectors of the transistors $T_1$ and $T_2$ are connected through loads to a source of potential $V_2$. A source of potential $V_1$ is connected to the bases of the transistors $T_1$ and $T_2$. Output terminals $O_1$ and $O_2$ of the circuit are connected to the collectors of the transistors $T_1$ and $T_2$ respectively. With this arrangement, the impedance presented to a signal appearing at the collector $C_1$ is very much smaller through the transistor $T_1$ than through the resistor $R_{C1C2}$. Similarly the transistor $T_2$ presents a much smaller resistance to a signal appearing at the collector $C_2$ than the resistor $R_{C1C2}$.

It will be apparent that various modifications may be made to the device shown in FIGURE 1. For example, the emitter and collector regions may be of P type conductivity material and the base region may be of N type conductivity material.

By way of example, typical dimensions of the device shown in FIGURES 1 and 2 would be:

Surface area of device 120 microns by 45 microns,
Thickness of epitaxial layer 5 microns,
Depth of collector-base junction 1.5 microns,
Thicknes of base 0.3 micron, and
Area of emitter 450 square microns.

The total area of the device shown in FIGURES 1 and 2 may be compared with the area taken up by two discrete transistors connected in the known way as described above. The two discrete transistors would have a total area of the order of 8,000 square microns as opposed to the 5,400 square microns of the device shown in FIGURES 1 and 2. It will be appreciated therefore that, because of its reduced surface area, the device shown in FIGURES 1 and 2 will give a higher yield during manufacture than two separate transistors. It should be noted that the areas given above take into account the area of wafer used for junction isolation.

One further improvement in the reduced size is the improved matching of the two halves of the device and the improved speed of the device.

With a device as described above manufactured from silicon with an impurity concentration in the epitaxial layer $10^{16}$ atoms per $cm.^{-3}$ and an impurity concentration at the surface of the base region of $2 \times 10^{18}$ atoms $cm.^{-3}$, the inter-collector resistance $R_{C1C2}$ would have a value of approximately 430 ohms and the inter-base resistance $R_{B1B2}$ would have a resistance of approximately 550 ohms.

In a modification of the device, not shown, a third electrical connection may be made to the base in such a manner as to center tap the resistor $R_{B1B2}$: this center tapping may then be connected to a source of reference potential. It will be appreciated that in this modification, two emitter regions, spaced by this third electrical connection to the base region, will be formed within the common base region.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor device comprising:
a first region of semiconductor material of first conductivity type;
a second region of opposite conductivity type formed within said first region;
a third region of said first conductivity type formed within the second region;
said first and second regions forming a P-N junction; said second and third regions forming a P-N junction;
a first base contact in the second region;

a second base contact in said second region and separated from said first base contact by said third region;
a first collector contact arranged within said first region;
a second collector contact arranged within said first region and spaced from said first collector contact by said second and third regions;
an emitter contact within said third region,
said base contacts being adapted to apply input signals thereto whereby a bias across the said second and third region P-N junction is affected by the flow of majority carriers in the said second region between the said first and second region P-N junction and the said second and third region P-N junction; and
means for reducing the flow of electrons between said first and second collector contacts.

2. A device as claimed in claim 1, comprising:
a fourth region of high first conductivity type located within or adjacent the first region beneath the first collector contact and the first base contact to provide a low resistance path therebetween, said first and fourth regions forming a P-N junction; and
a fifth region of high first conductivity type located within or adjacent said first region beneath said second collector contact and said second base contact to provide a low resistance path therebetween, said first and fifth regions forming a P-N junction.

3. A device as claimed in claim 1, wherein said first region is an epitaxial layer formed on a wafer of semiconductor material of opposite conductivity type.

4. A device as claimed in claim 1, wherein said third region is of high conductivity.

5. A device as claimed in claim 1, wherein said first and second collector contacts are made to said first region through regions of high first conductivity type.

6. A device as claimed in claim 1, wherein said first conductivity type is of N type conductivity silicon, and wherein said opposite conductivity type is of P type conductivity silicon.

References Cited

UNITED STATES PATENTS

| | | | |
|---|---|---|---|
| 2,993,998 | 7/1961 | Lehovec | 250—211 |
| 3,007,091 | 10/1961 | Fuller | 317—235 |
| 3,213,339 | 10/1965 | Henkels | 317—235 |
| 3,349,300 | 10/1967 | Koepp et al. | 317—235 |

JAMES D. KALLAM, Primary Examiner

U.S. Cl. X.R.

317—234; 330—38